United States Patent
Shimizu et al.

(10) Patent No.: US 7,413,977 B2
(45) Date of Patent: Aug. 19, 2008

(54) METHOD OF MANUFACTURING SEMICONDUCTOR DEVICE SUITABLE FOR FORMING WIRING USING DAMASCENE METHOD

(75) Inventors: Noriyoshi Shimizu, Kawasaki (JP);
Nobuyuki Ohtsuka, Kawasaki (JP);
Hideki Kitada, Kawasaki (JP);
Yoshiyuki Nakao, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 190 days.

(21) Appl. No.: 11/318,530

(22) Filed: Dec. 28, 2005

(65) Prior Publication Data
US 2007/0048931 A1    Mar. 1, 2007

(30) Foreign Application Priority Data
Aug. 30, 2005   (JP) ............................ 2005-250046

(51) Int. Cl.
*H01L 21/4763* (2006.01)

(52) U.S. Cl. ...................... 438/637; 438/638; 438/672; 438/673; 438/E21.584

(58) Field of Classification Search ......... 438/618–624, 438/637–639, 672–673
See application file for complete search history.

(56) References Cited

U.S. PATENT DOCUMENTS

2005/0218519 A1*   10/2005   Koike et al. ................. 257/756

OTHER PUBLICATIONS

W.A. Lanford et al., "Low-temperature passivation of copper by doping with Al or Mg", ThinSolid Films 262, pp. 234-241 (1995).
T Usui et al., "Low Resistive and Highly Reliable Cu Dual-Damascene Interconnect Technology Using Self-Formed $MnS_{ix}O_y$ Barrier Layer", IITC Session 9.2, 2005.

* cited by examiner

*Primary Examiner*—Dung A Le
(74) *Attorney, Agent, or Firm*—Westerman, Hattori, Daniels & Adrian, LLP.

(57) ABSTRACT

A concave portion is formed in an interlayer insulating film formed on a semiconductor substrate. Then a first film of Mn is formed by CVD, the first film covering the inner surface of the concave portion and the upper surface of the insulating film. Then conductive material essentially consisting of Cu is deposited on the first film to embed the conductive material in the concave portion. Then the semiconductor substrate is annealed. During the period until a barrier layer is formed having also a function of improving tight adhesion, it is possible to ensure sufficient tight adhesion of wiring members and prevent peel-off of the wiring members.

4 Claims, 8 Drawing Sheets

FIG.2

| EMBODIMENTS | UNDERLYING FILM | | CONDUCTIVE MEMBER |
|---|---|---|---|
| | FIRST FILM | SECOND FLM (ELECTRODE) | |
| 1 | CVD-Mn | CVD-Cu | EP-Cu |
| 2 | CVD-Mn | SPUTTER-Cu | EP-Cu |
| 3 | SPUTTER-CuMn | CVD-Cu | EP-Cu |
| 4 | CVD-CuMn | SPUTTER-Cu | EP-Cu |
| 5 | CVD-CuMn | | EP-Cu |
| 6 | CVD-Mn/CVD-Cu | | EP-Cu |
| 7 | CVD-Mn | - | CVD-Cu |
| 8 | CVD-CuMn | - | CVD-Cu |
| 9 | - | - | CVD-CuMn |

METHOD OF MANUFACTURING SEMICONDUCTOR DEVICE SUITABLE FOR FORMING WIRING USING DAMASCENE METHOD

CROSS REFERENCE TO RELATED APPLICATION

This application is based on and claims priority of JP2005-250046 filed on Aug. 30, 2005, the entire contents of which are incorporated herein by reference.

BACKGROUND OF THE INVENTION

A) Field of the Invention

The present invention relates to a semiconductor device manufacture method, and more particularly to a semiconductor device manufacture method suitable for forming wirings by a damascene method by which a concave portion formed in an interlayer insulating film is filled with a conductive member.

B) Description of the Related Art

Miniaturization of wirings and increasing of wiring layers are progressing as semiconductor elements are highly integrated and chip sizes are reduced. In a logical element having a multi-layer wiring structure, a delay of a signal transmitting along a wiring is becoming a dominant factor of lowering an operation speed of the logical element. The delay of a signal transmitting along a wiring is proportional to a product of a wiring resistance and a parasitic capacitance between wirings.

Technologies of using copper (Cu) having a low resistivity as wiring material are adopted practically in order to reduce wiring resistance. Since it is difficult to pattern a copper film by using photolithography process, a damascene method is generally adopted to form copper wirings.

When a copper wiring is formed by the damascene method, the inner surface of a wiring trench and a via hole is covered with a barrier layer before the copper film is deposited, the main object of the barrier layer being to prevent diffusion of copper into an insulating film. Refractory metal such as tantalum (Ta) and tungsten (W) is used as the material of a barrier film. Refractory metal has a resistivity higher than that of copper.

As the size of a wiring becomes fine, a ratio of the barrier layer occupying the cross section of the wiring becomes large. Therefore, the barrier layer has a large factor of raising a wiring resistance. Especially, in a fine multi-layer wiring structure having a diameter and wiring width of a via hole of 0.1 µm or smaller, it is desired to make the barrier layer as thin as possible.

The document "Low-temperature passivation of copper by doping with Al or Mg" by W. A. Lanford et al., Thin Solid Films, 262(1995), pp. 234 to 241 discloses the technique of forming an Al oxide or Mg oxide layer on the surface of Cu by doping Al or Mg into Cu and performing heat treatment. This oxide layer functions as a protective film and diffusion preventing film for Cu.

Next, description will be made on a method of forming a thin barrier layer having a uniform thickness, disclosed in the document "Low Resistive and Highly Reliable Cu Dual-Damascene Interconnect Technology Using Self-Formed $MnSi_xO_y$ Barrier layer" by T. Usui et al., IITC 2005, Session 9.2. A seed layer of CuMn alloy is formed by sputtering on the surface of an interlayer insulating film formed with wiring trenches and via holes. Thereafter, copper is electroplated to fill the wiring groove and via hole with the copper. Heat treatment is performed to react Si and O as the constituent elements in the interlayer insulating film with Mn as the constituent element in the seed layer. A barrier layer is therefore formed at the interface between a Cu wiring and the interlayer insulating film, the barrier layer being made of $MnSi_xO_y$ compound which is very thin about 2 to 3 nm in thickness and has a uniform thickness. This barrier layer prevents diffusion of Cu.

The seed layer covering the bottom of the via hole does not contact the interlayer insulating film and contacts a lower level wiring. Therefore, the barrier layer is not formed at the interface between the copper wiring in the via hole and the lower level wiring, so that the upper and lower level wirings can be connected without the barrier layer between the upper and lower level wirings. Further, since the barrier layer made of MnSiO compound can be made thinner than a barrier layer made of refractory metal, it is possible to suppress an increase of wiring resistance.

SUMMARY OF THE INVENTION

In a conventional method of forming a barrier layer made of MnSiO compound at an interface between a copper wiring and an interlayer insulating film, the barrier layer has also a function of enhancing tight adhesion of the copper wiring. The barrier layer made of MnSiO compound is not formed during the period after the seed layer of CuMn alloy is formed and before heat treatment is executed. The present inventors have found that sufficient tight adhesion is not obtained between the seed layer and interlayer insulating film in such a state where the barrier layer is not formed. More specifically, a copper wiring may be peeled off after copper is electroplated and before heat treatment is executed.

Tight adhesion was evaluated by forming 25 samples which have CuMn alloy layers having a thickness of 90 nm formed on a surface of each of silicon oxide films, porous methylsilsesquioxane (porous MSQ) films, SiCN films and SiOC films. Tape tests were conducted and peel-off arose in all samples. Tape tests were conducted after heat treatment for one minute at 300° C. in a nitrogen atmosphere, and peel-off did not arise in any samples. This may be ascribed to improved tight adhesion because heat treatment forms a barrier layer of MnSiO compound. It can be understood from this that the state before heat treatment does not ensure sufficient tight adhesion.

It is expected that a copper wiring can be prevented from being peeled off, if heat treatment is executed to form a barrier layer of MnSiO compound before copper electroplating is performed. However, heat treatment is executed before copper electroplating, the seed layer of CuMn alloy is aggregated and it becomes difficult to fill a wiring trench and a via hole with copper at good reproductivity.

An object of the present invention is to provide a semiconductor device manufacture method capable of obtaining sufficient tight adhesion of wiring material and preventing peel-off of the wiring material before a barrier layer having also a function of improving tight adhesion is formed. Another object of the present invention is to provide a semiconductor device suitable for being manufactured by this method.

According to one aspect of the present invention, there is provided a semiconductor device manufacture method comprising steps of: (a1) forming a concave portion in an interlayer insulating film formed on a semiconductor substrate; (a2) forming a first film of Mn by CVD, the first film covering an inner surface of the concave portion and an upper surface of the insulating film; (a3) depositing conductive material essentially consisting of Cu on the first film to embed the conductive material in the concave portion; and (a4) annealing the semiconductor substrate.

According to another aspect of the present invention, there is provided a semiconductor device manufacture method comprising steps of: (b1) forming a concave portion in an interlayer insulating film formed on a semiconductor substrate; (b2) forming a first film containing Cu and Mn by CVD, the first film covering an inner surface of the concave portion and an upper surface of the insulating film; (b3) depositing conductive material essentially consisting of Cu on the first film to embed the conductive material in the concave portion; and (b4) annealing the semiconductor substrate.

According to another aspect of the present invention, there is provided a semiconductor device manufacture method comprising steps of: (c1) forming a concave portion in an interlayer insulating film formed on a semiconductor substrate; (c2) forming a first film containing Cu and Mn by sputtering, the first film covering an inner surface of the concave portion and an upper surface of the insulating film; (c3) forming a second film of conductive material essentially consisting of Cu by CVD on the first film; and (c4) embedding conductive material essentially consisting of Cu in the concave portion.

According to another aspect of the present invention, there is provided a semiconductor device manufacture method of depositing alloy containing Cu and Mn on a semiconductor substrate by CVD while Mn source material and Cu source material are supplied at the same time.

Sufficient adhesion can be ensured by forming the first film by CVD in the step (a2) or (b2). If the first film is formed by sputtering in the step (c2), tight adhesion can be ensured while the second film is formed by CVD in the step (c2).

BRIEF DESCRIPTION OF THE DRAWINGS

FIG. 2 is a table showing materials of an underlying film and a conductive member and film forming methods adopted by semiconductor device manufacture methods according to the first to ninth embodiments.

DESCRIPTION OF THE PREFERRED EMBODIMENTS

Figure 1:
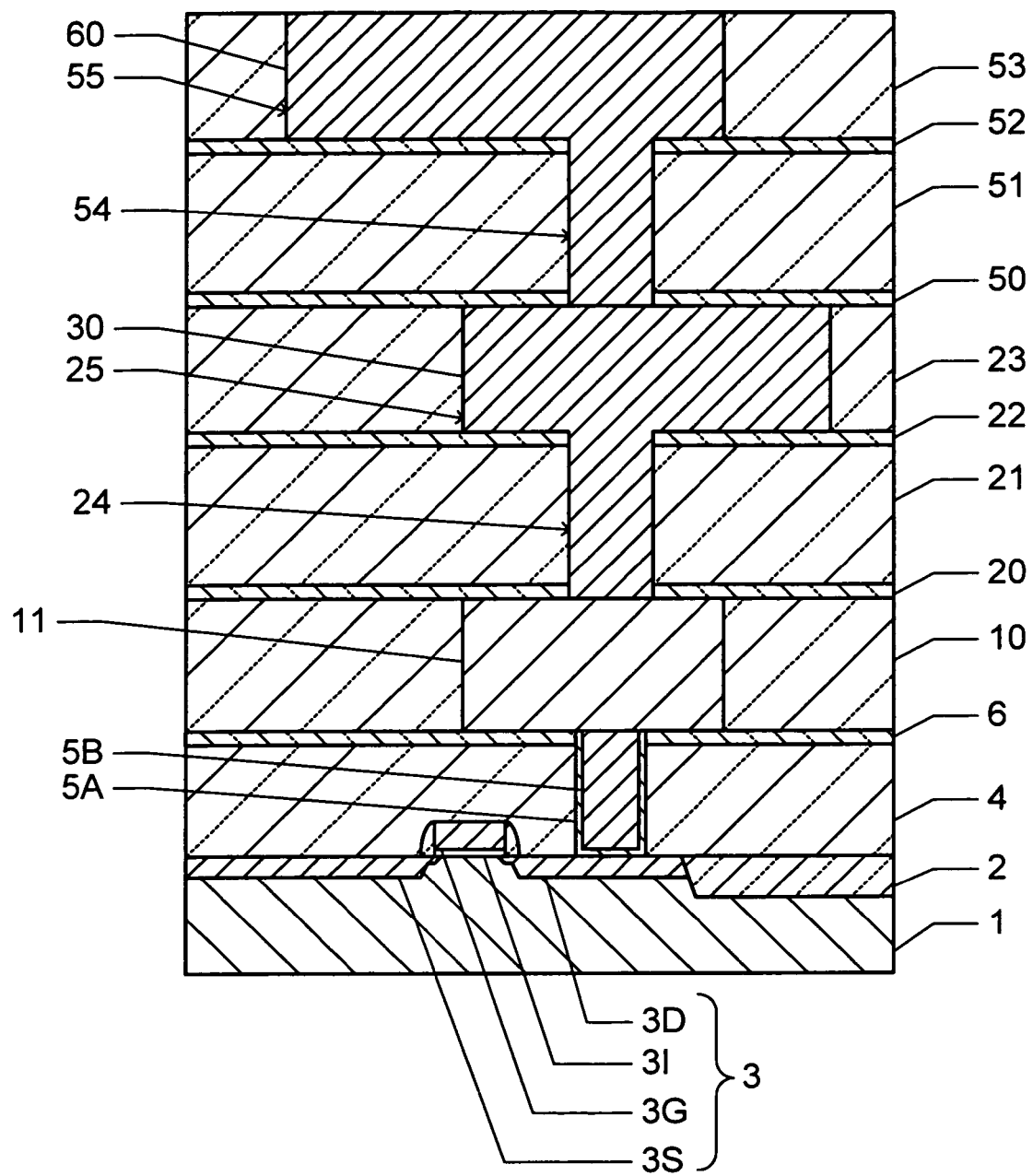
FIG. 1 is a cross sectional view of a semiconductor device manufactured by a semiconductor device manufacture method according to an embodiment.

FIG. 1 is a schematic cross sectional view of a semiconductor device manufactured by an embodiment method. An element isolation insulating film 2 is formed in a surface layer of a semiconductor substrate 1 by shallow trench isolation (STI) to define a plurality of active regions. A MOS transistor 3 is formed in an active region. The MOS transistor 3 is constituted of a source region 3S, a drain region 3D, a gate insulating film 31 and a gate electrode 3G.

An interlayer insulating film 4 of silicon oxide having a thickness of 300 nm and a protective film 6 of SiOC having a thickness of 50 nm are formed on the semiconductor substrate 1, covering the MOS transistor 3. A via hole is formed through the protective film 6 and interlayer insulating film 4, to expose a partial surface of the drain region 3D on the bottom of the via hole. A conductive plug 5B of tungsten (W) is embedded in the via hole. A barrier metal layer 5A of TiN having a thickness of 25 nm is disposed between the conductive plug 5B and the inner surface of the via hole.

The structure described above can be formed by well-known photolithography, etching, chemical vapor deposition (CVD), chemical mechanical polishing (CMP) and the like.

An interlayer insulating film 10 made of low dielectric constant insulating material is formed on the protective film 6. A wiring trench is formed in the interlayer insulating film 10, reaching the bottom of the film 10 and crossing over the conductive plug 5B. A first layer copper wiring 11 is embedded in the wiring trench. The copper wiring 11 is connected to the conductive plug 5B.

A cap film 20, a via interlayer insulating film 21, an etching stopper film 22 and a wiring interlayer insulating film 23 are formed on the interlayer insulating film 10 in this order recited.

A wiring trench 25 is formed in the wiring interlayer insulating film 23, and a via hole 24 is formed in the via interlayer insulating film 21. The wiring trench 25 reaches the upper surface of the etching stopper film 22. The via hole 24 opens on the bottom of the wiring trench 25 and reaches the upper surface of the lower level wiring 11 through the cap film 20.

A conductive member 30 of copper or copper alloy is embedded in the wiring trench 25 and via hole 24. The conductive member 30 is connected to the first layer wiring 11 to constitute a second layer wiring. The detailed structure including the barrier layer will be later described in each of the embodiments.

A cap film 50, a via interlayer insulating film 51, an etching stopper film 52 and a wiring interlayer insulating film 53 are stacked on the wiring interlayer insulating film 23. Similar to the second level wiring structure, a wiring trench 55 and a via hole 54 are formed and a conductive member 60 is deposited therein. The conductive member 60 constitutes a third layer wiring.

Next, description will be made on the first to ninth embodiments characterized in the methods of forming the first layer wiring 11, second layer conductive member 30 and third layer conductive member 60.

FIG. 2 shows a list of materials and deposition methods of an underlying film and a conductive member when a wiring or conductive member is formed by the methods of the first to ninth embodiments. "CVD", "SPUTTER" and "EP" described to the left of hyphens in the list mean film formation by a CVD method, a sputtering method and an electroplating method, respectively. "Mn", "Cu" and "CuMn" described to the right of hyphens in the list mean that the materials of deposited films are Mn, Cu and CuMn alloy, respectively.

With reference to FIGS. 3A to 3F, description will be made on a semiconductor device manufacture method according to the first embodiment. In the following description, attention is paid to a method of forming the second layer wiring structure from the cap layer 20 to interlayer insulating film 23. The second layer wiring structure is formed by a dual damascene method. The third layer wiring structure is formed by the same method as that used for the second layer wiring structure. The first layer wiring 11 is formed by a single damascene method, and a barrier layer forming method, a method of depositing a conductive member in the wiring trench are the same as those adopted in the method of forming the second layer wiring structure.

Figure 3A:
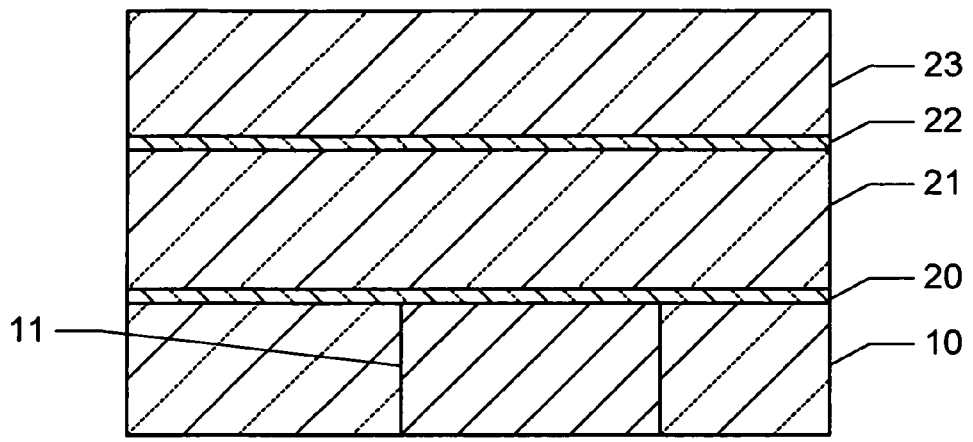
FIGS. 3A to 3F are cross sectional views of a device during manufacture, illustrating the semiconductor device manufacture method according to the first embodiment.

As shown in FIG. 3A, a cap film 20, a via interlayer insulating film 21, an etching stopper film 22 and a wiring interlayer insulating film 23 are sequentially formed on an interlayer insulating film 10. For example, the cap film 20 has a two-layer structure of a silicon oxide (SiO) film and a silicon carbide (SiC) film, and has a total thickness of 20 to 70 nm. For example, the etching stopper film 22 is made of SiC or silicon nitride (SiN) and has a thickness of 20 to 70 nm. These films can be formed by CVD.

The interlayer insulating films 21 and 23 are made of organic or inorganic low dielectric constant insulating material and have a thickness of 300 to 700 nm. The inorganic low dielectric constant insulating material may be porous silica or SiOC. The organic low dielectric constant insulating material may be SiLK (registered trademark) manufactured by the Dow Chemical Company. These materials contain Si and O as the constituent elements.

Figure 3B:
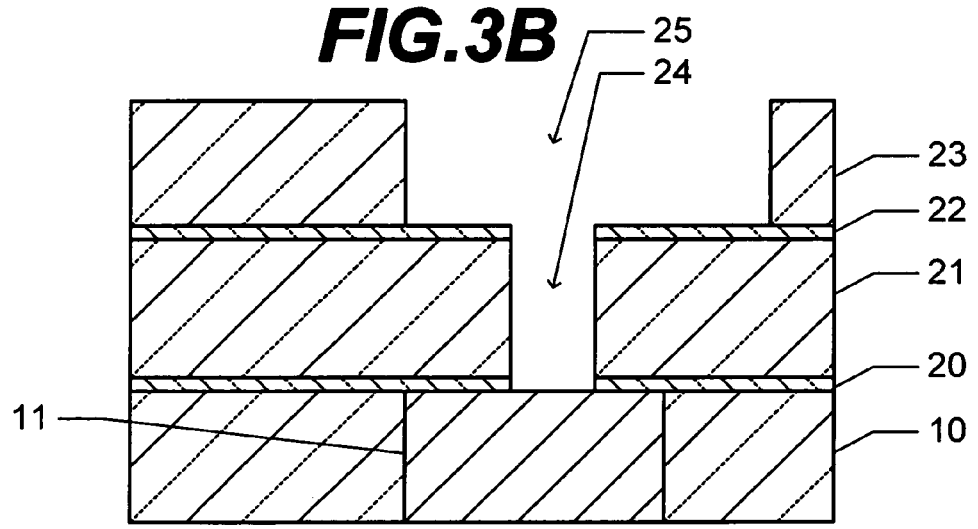

As shown in FIG. 3B, a wiring trench 25 is formed through the wiring interlayer insulating film 23, and a via hole 24 is formed through the via interlayer insulating film 21. For example, the size of the via hole 24 in a plan cross section is 0.06 to 0.1 μm and a minimum width of the wiring trench 25 is 0.06 μm. The wiring trench 25 and via hole 24 can be formed by dry etching using CF-containing etching gas and by using a hard mask constituted of, for example, two layers of an SiO film and an SiC film. The wiring trench 25 reaches the upper surface of the etching stopper film 22, and the via hole 24 reaches the upper surface of the first layer wiring 11.

Figure 3C:
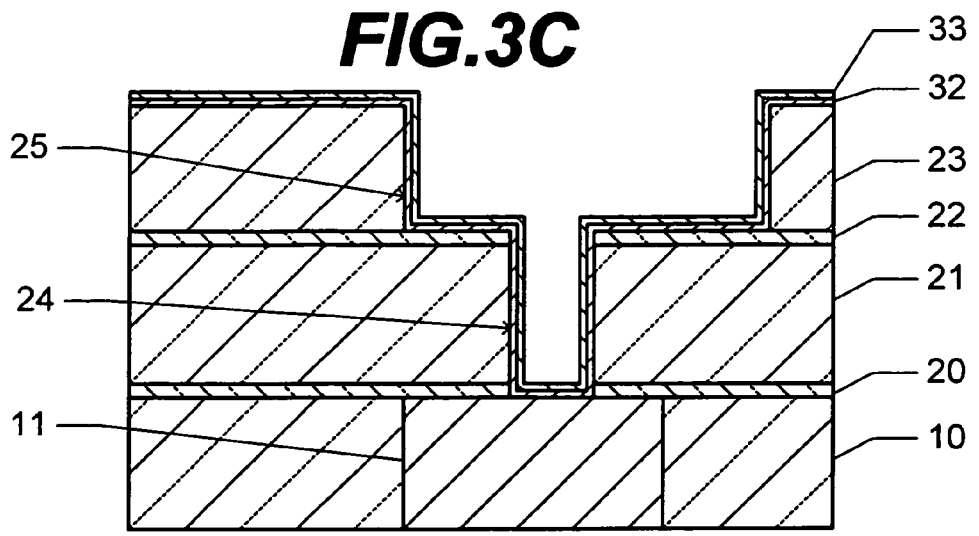

As shown in FIG. 3C, Mn is deposited by CVD on the upper surface of the wiring interlayer insulating film 23, the inner surface of the wiring trench 25 and the inner surface of the via hole 24 to thereby form a first film 32 having a thickness of about 2 nm. In the same chamber, Cu is deposited by CVD to form a second film 33. A preferred thickness of the second film 33 is determined by the size of a plan pattern of the via hole 24. The "size of a plan pattern" means a diameter of a circle inscribed to the plan pattern of the via hole 24. For example, if the plan cross section of the via hole 24 is a circle, the size of the plan pattern is the diameter of the circle, whereas if the plan cross section is a square, the size of the plan pattern is the length of one side of the square. In the following description, the size of the plan pattern of the via hole is called "via diameter". If the via diameter is 70 nm, a preferred thickness of the second film 23 is about 10 nm.

Figure 4:
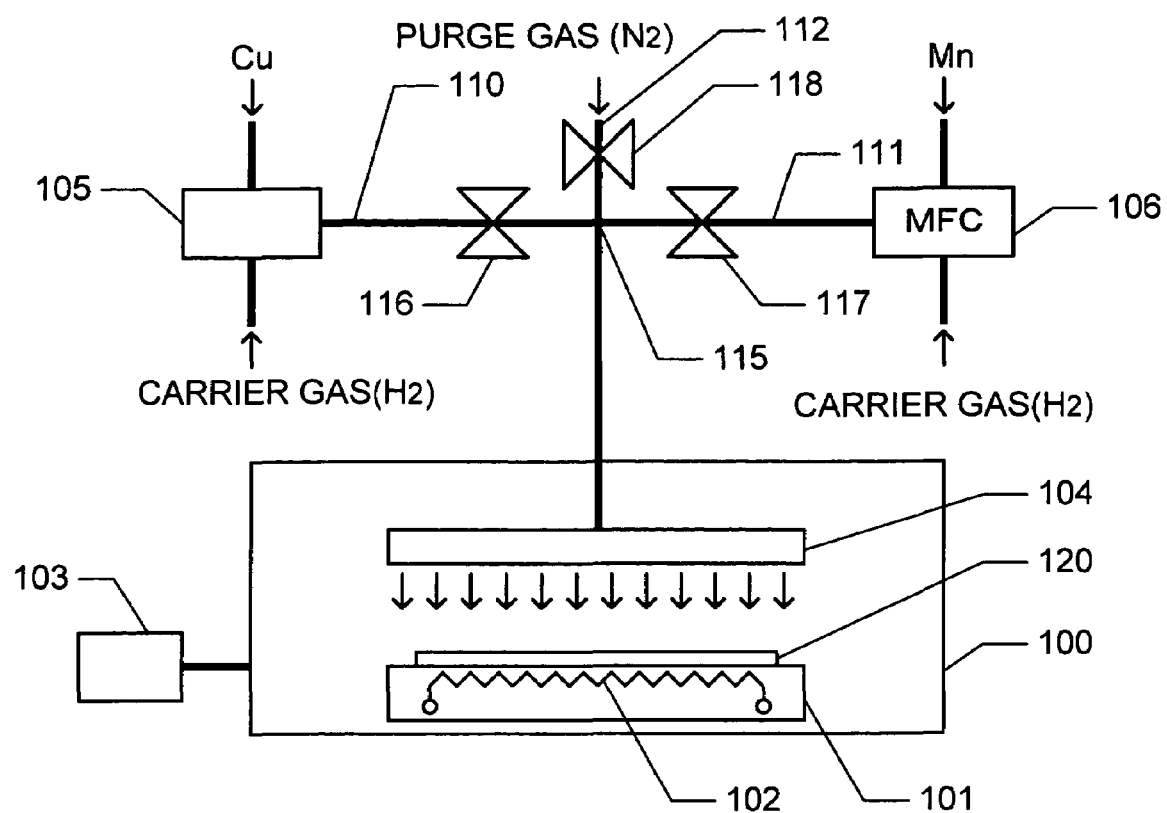
FIG. 4 is a schematic diagram showing a CVD system to be used by the semiconductor device manufacture methods of the embodiments.

FIG. 4 is a schematic diagram of a CVD system. A substrate stage 101 is disposed in a chamber 100. A vacuum pump 103 evacuates and exhausts the air in the chamber 100. A heater 102 is mounted in the substrate stage 101. A semiconductor substrate 120 to be processed is held on the upper surface of the substrate stage 101. A shower head 104 is disposed above the substrate stage 101.

Carrier gas, e.g., $H_2$ gas and liquid source material of Cu is supplied to a carburetor 105. Trimethylvinylsilyl-hexafluoroacetylacetonate copper (I) (hereinafter expressed as "Cu (hfac) tmvs) is used as Cu source material. Cu liquid source material is vaporized in the carburetor 105 and supplied to a gas flow path 110 together with the carrier gas.

Carrier gas, e.g., $H_2$ gas and Mn source material is supplied to a mass flow controller (MFC) 106. Bismethylcyclopentadienyl manganese (($CH_3C_5H_4)_2Mn$) is used as Mn source material. Mn source material is vaporized in MFC 106 and supplied to a gas flow path 111 together with the carrier gas. Purge gas, e.g., $H_2$ gas, is supplied to a gas flow path 112.

The three gas flow paths 110, 111 and 112 become confluent at a confluent point 115 and thereafter are connected to the shower head 104. Valves 116, 117 and 118 are inserted into the three gas flow paths 110, 111 and 112, respectively. By controlling open/close of these valves 116 to 118, desired gasses can be supplied to the shower head 104. Gas supplied to the shower head 104 is jetted out toward the semiconductor substrate 120 held on the substrate stage 101.

Description will be made on a method of forming the first film 32 and second film 33 shown in FIG. 3C. After the semiconductor substrate shown in FIG. 3B is placed on the substrate stage 101 heated in advance, the inside of the chamber 100 is evacuated. The valve 117 is opened to supply Mn source material to the chamber 100. The film forming conditions are a substrate temperature of 100° C. to 300° C., typically 200° C., an inner pressure of the chamber 100 of 0.3 Pa to 3 kPa, typically 500 Pa, an Mn source material flow rate of 0.2 g/min and a carrier gas flow rate of 500 sccm. When the first film of Mn having a thickness of about 2 nm is formed, the valve 117 is closed and gas resident in the chamber 100 is exhausted.

Thereafter, the valve 116 is opened to supply Cu source material to the chamber 100. The film forming conditions are a substrate temperature of 200° C., a pressure in the chamber 100 of 500 Pa, a Cu source material flow rate of 1.0 g/min and a carrier gas flow rate of 500 sccm.

Figure 3D:
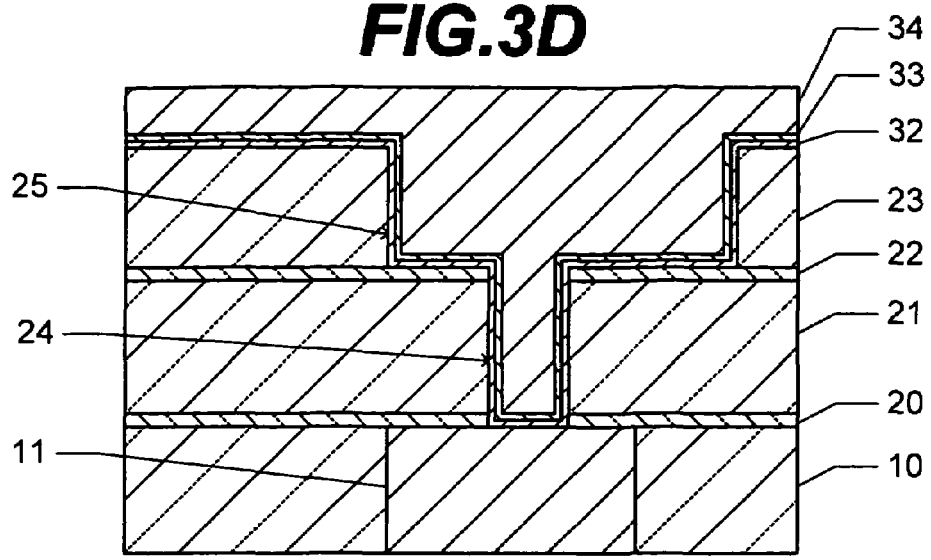

As shown in FIG. 3D, copper (Cu) is electroplated by using the second film 33 as an electrode to form a conductive member 34. The wiring trench 25 and via hole 24 are filled with the conductive member 34. Annealing is performed for about 5 minutes at a temperature of 300° C. to 400° C. in an atmosphere which contains a small amount of oxygen.

Figure 3E:
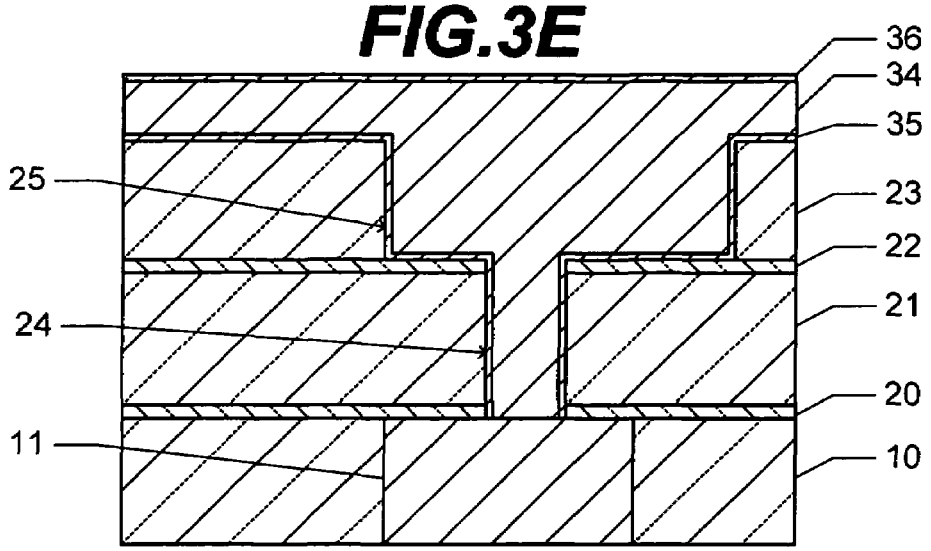

FIG. 3E is a cross sectional view of the substrate after annealing. Mn atoms in the first film 32 react with Si and O in the interlayer insulating films 21 and 23 and etching stopper film 22 to form a barrier layer 35 of MnSiO. Mn atoms, which diffused in the conductive member 34 and reached the upper surface, react with oxygen. Therefore, a cover film 36 of manganese oxide is formed on the surface of the conductive member 34. The first film 32 of Mn is merged with the barrier layer 35 and extinguishes, and the second film 33 of Cu is merged with the conductive member 34.

Figure 3F:
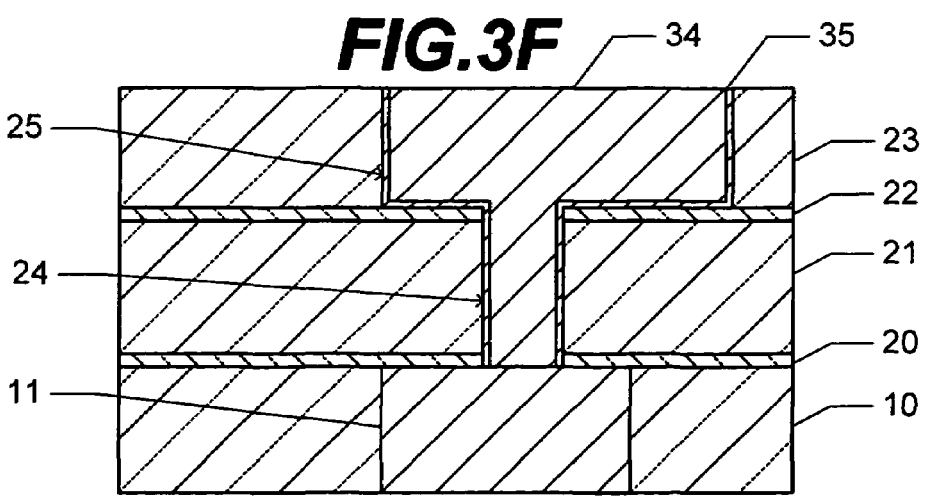

As shown in FIG. 3F, an unnecessary conductive member 34 is removed by chemical mechanical polishing (CMP). The conductive member 34 left in the wiring trench 25 and via hole 24 constitutes the second layer wiring and functions also as an interlayer connection member between the first and second layer wirings. A portion of the hard mask used as an etching mask when the wiring trench 25 shown in FIG. 3B is formed may be left on the interlayer insulating film 23 to use this hard mask as a polishing stopper film of CMP.

In the first embodiment described above, the barrier layer 35 prevents copper diffusion and improves adhesion of the conductive member 34. Until the barrier layer 35 is formed, i.e., in the states shown in FIGS. 3C and 3D, the first film 32 of Mn formed by CVD ensures sufficient adhesion to the underlying insulating film. Since the second film 33 of Cu is used as the electrode for electroplating, the electrode resistance can be lowered compared to a conventional method using a CuMn alloy film as the electrode. Since the second film 33 is formed by CVD, a thickness of the second film 33 can be made more uniform than the case where the film is formed by sputtering.

In the first embodiment, although the first film 32 and second film 33 are formed by CVD, these films may be formed by ALD which is a specific example of CVD. If the first film 32 is to be formed by ALD, supply of Mn source material and purge in the chamber 100 by using purge gas are alternately repeated. If the second film 33 is to be formed by ALD, supply of Cu source material and purge in the chamber 100 by using purge gas are alternately repeated.

In the first embodiment, $(CH_3C_5H_4)_2Mn$ is used as Mn source material. This source material has a vapor pressure of about 133 Pa (1 Torr) at a temperature of 85° C. to 90° C. If a cyclopenta group is wholly desorbed from Mn atoms, it is advantageous in that impurities are hard to be mixed in the first film 32. The cyclopenta group and Mn atoms are coupled through π coupling. This π coupling is relatively weak coupling so that the cyclopenta group is easy to be desorbed from Mn atoms even at a low temperature.

Mn source material having such advantages may include bisisopropylcyclopentadienyl manganese $((i-C_3H_7C_5H_4)_2 Mn)$. $(i-C_3H_7C_5H_4)_2Mn$ is liquid at an ordinary temperature and has a vapor pressure of 33.25 Pa (0.25 Torr) at a temperature of 87° C. to 88° C.

Next, description will be made on a semiconductor device manufacture method according to the second embodiment. In the first embodiment described above, the second film 33 shown in FIG. 3C is formed by CVD. In the second embodiment, the second film 33 of Cu is formed by sputtering. The other processes are the same as those of the semiconductor device manufacture method of the first embodiment. When the second film 33 is to be formed by sputtering, a preferred thickness of the second film 33 is 20 nm to 100 nm at a via diameter of 70 nm of the via hole 24. A film deposited on the inner surface of the via hole 24 is thinner than a film deposited on a flat surface.

Since a method of forming a Cu film by sputtering is already use in a mass production, the method has excellent process stability. Also in the second embodiment, since the first film 32 is formed by CVD, sufficient adhesion can be ensured between the first film 32 and underlying insulating film.

Next, description will be made on a semiconductor device manufacture method according to the third embodiment. In the third embodiment, the first film 32 shown in FIG. 3C is formed by sputtering using alloy containing Cu and Mn as a target. The first film 32 is therefore made of alloy containing Cu and Mn. The other processes are the same as those of the semiconductor device manufacture method of the first embodiment. A thickness of the first film 32 is 2 nm to 5 nm.

In the third embodiment, sufficient adhesion can be ensured between the first film 32 and underlying insulating film while the second film 33 is formed by CVD at a substrate temperature condition of 200° C. after the first film 32 shown in FIG. 3C is formed by sputtering.

Next, description will be made on a semiconductor device manufacture method according to the fourth embodiment. In the fourth embodiment, the first film 32 shown in FIG. 3C is formed by CVD and made of alloy containing Cu and Mn. A thickness of the first film 32 is 2 nm to 5 nm. Similar to the second embodiment, the second film 33 is formed by sputtering. Similar to the first embodiment, the second film 33 may be formed by CVD.

In the following, with reference to FIG. 4, description will be made on a method of forming the first film 32 of alloy containing Cu and Mn by CVD. After the semiconductor substrate shown in FIG. 3B is placed on the substrate stage 101 heated in advance, the inside of the chamber 100 is evacuated. The valves 116 and 117 are opened to supply Cu and Mn source materials to the chamber 100 at the same time. The film forming conditions are a substrate temperature of 100° C. to 300° C., typically 200° C., an inner pressure of the chamber 100 of 0.3 Pa to 3 kPa, typically 500 Pa, an Mn source material flow rate of 0.2 g/min, a Cu source material flow rate of 1.0 g/min and a carrier gas flow rate of 500 sccm.

The Cu source material and Mn source material used in the embodiment can respectively deposit a Cu film and an Mn film at the same substrate temperature. Byproducts desorbed from Cu atoms and Mn atoms are stable substance. Therefore, side reaction is hard to occur between byproducts. Cu and Mn have similar electronegativities (Mn has an electronegativity of 1.5 and Cu has an electronegativity of 1.9). Side reaction is therefore hard to occur between Cu and compound desorbed from Mn and between Mn and compound desorbed from Cu. From these reasons, it is possible to supply Cu source material and Mn source material at the same time and deposit CuMn alloy.

The first film 32 may be formed by ALD which is a specific example of CVD. When the first film 32 is to be formed by ALD, concurrent supply of Mn source material and Cu source material and purge in the chamber 100 by using purge gas are alternately repeated.

Also in the fourth embodiment, since the first film 32 contains Mn, the barrier layer 35 of MnSiO shown in FIG. 3E can be formed. Since the first film 32 is formed by CVD, sufficient adhesion can be ensured between the first film 32 and underlying insulating film.

Next, with reference to FIGS. 5A to 5C, description will be made on a semiconductor device manufacture method according to the fifth embodiment.

Figure 5A:
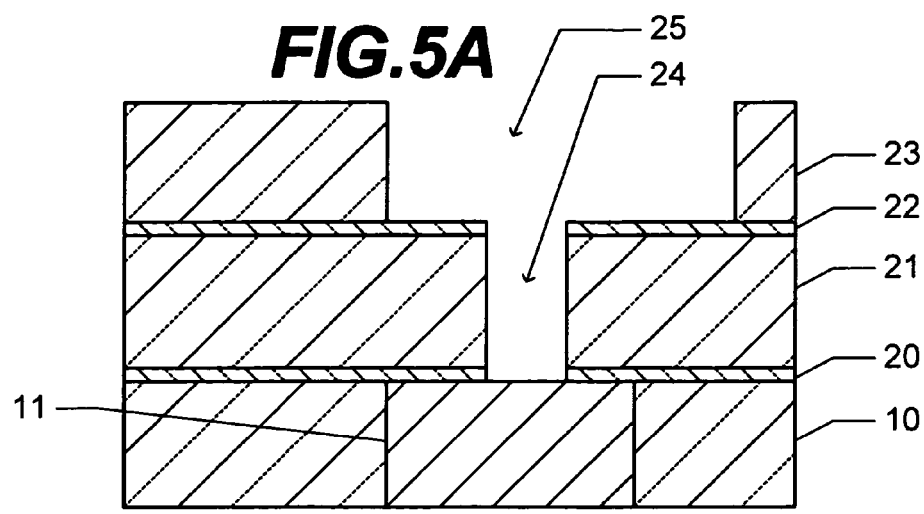
FIGS. 5A to 5C are cross sectional views of a device during manufacture, illustrating the semiconductor device manufacture method according to the fifth embodiment.

The structure shown in FIG. 5A is the same as that of FIG. 3B referred to when the manufacture method of the first embodiment was described.

Figure 5B:
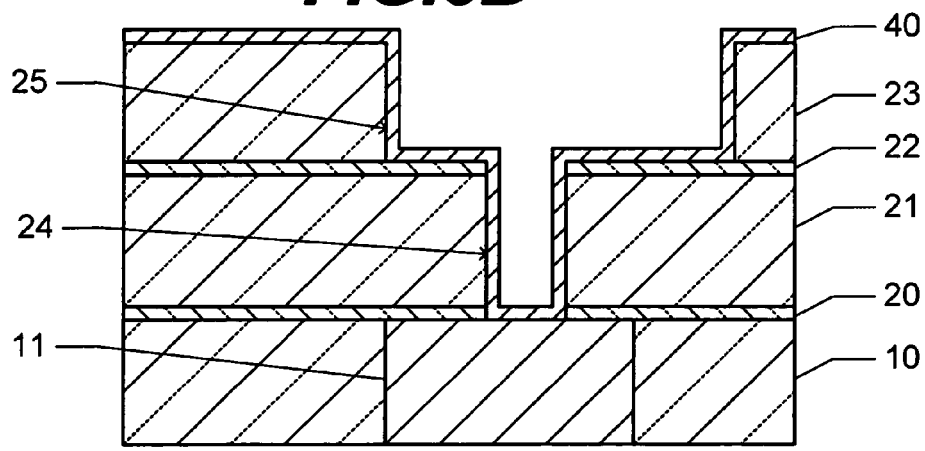

As shown in FIG. 5B, alloy containing Cu and Mn is deposited by CVD on the upper surface of the wiring interlayer insulating film 23, the inner surface of the wiring trench 25 and the inner surface of the via hole 24 to form an underlying film 40 having a thickness of about 5 nm to 50 nm. A method of forming the underlying film 40 is similar to that of forming the first film 32 of the fourth embodiment. However, a ratio of the supply amount of Mn to the supply amount of Cu is adjusted so that the total number of Mn atoms in the underlying film 40 is substantially equal to that of Mn atoms in the Mn film having a thickness of about 2 nm.

Figure 5C:
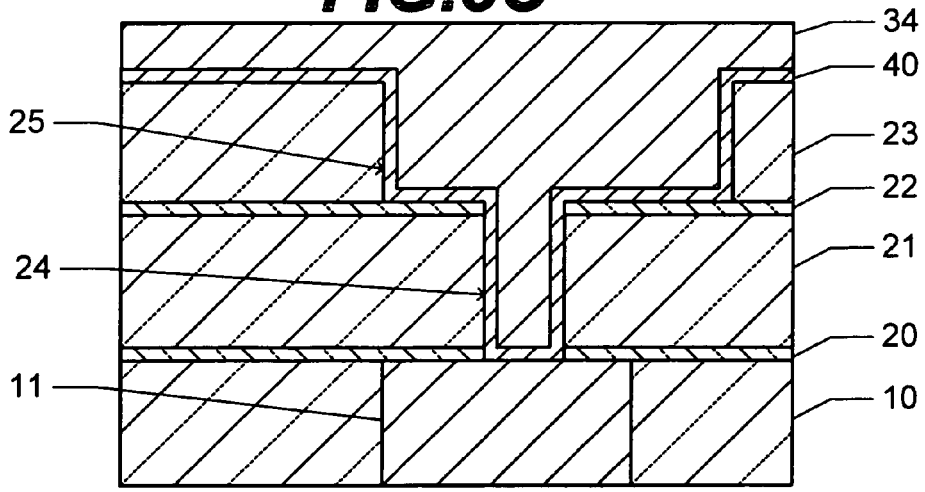

As shown in FIG. 5C, Cu is electroplated by using the underlying film 40 as an electrode to form a conductive member 34. Therefore, the wiring trench 25 and via hole 24 are fully filled with the conductive member 34. The subsequent processes are the same as those executed after the intermediate time shown in FIG. 3D.

In the fifth embodiment, since the underlying film 40 shown in FIG. 5B is formed by CVD, sufficient adhesion can be ensured between the underlying film 40 and underlying insulating film. As compared to forming the underlying film by sputtering, a thickness of the underlying film 40 can be made generally uniform.

Next, description will be made on a semiconductor device manufacture method according to the sixth embodiment. Although Mn and Cu source materials are supplied at the same time to form the underlying film 40 shown in FIG. 5B in the fifth embodiment, two source materials are supplied alternately in the sixth embodiment. The other processes are the same as those of the manufacture method of the fifth embodiment. However, a ratio of the supply amount of Mn to the supply amount of Cu is adjusted so that the total number of Mn atoms in the underlying film 40 is substantially equal to that of Mn atoms in the Mn film having a thickness of about 2 nm. ALD may be adopted by which the supply of source material and the supply of purge gas are alternately repeated during the supply period of Mn source material and during the supply period of Cu source material.

Also in the sixth embodiment, since the underlying film 40 is formed by CVD, similar effects to those of the fifth embodiment can be obtained.

Next, with reference to FIGS. 6A to 6C, description will be made on a semiconductor device manufacture method according to the seventh embodiment.

Figure 6A:
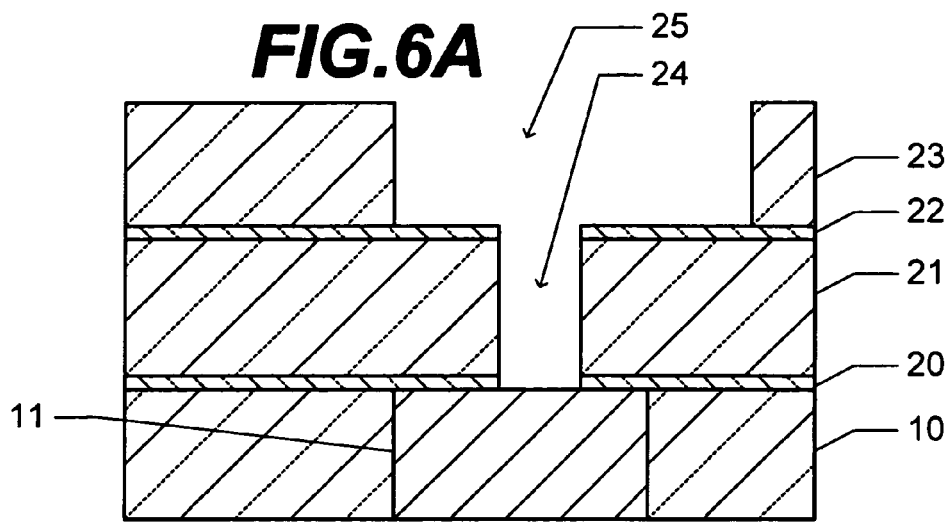
FIGS. 6A to 6C are cross sectional views of a device during manufacture, illustrating the semiconductor device manufacture method according to the seventh embodiment.

The structure shown in FIG. 6A is the same as that shown in FIG. 3B referred to when the manufacture method of the first embodiment was described.

Figure 6B:
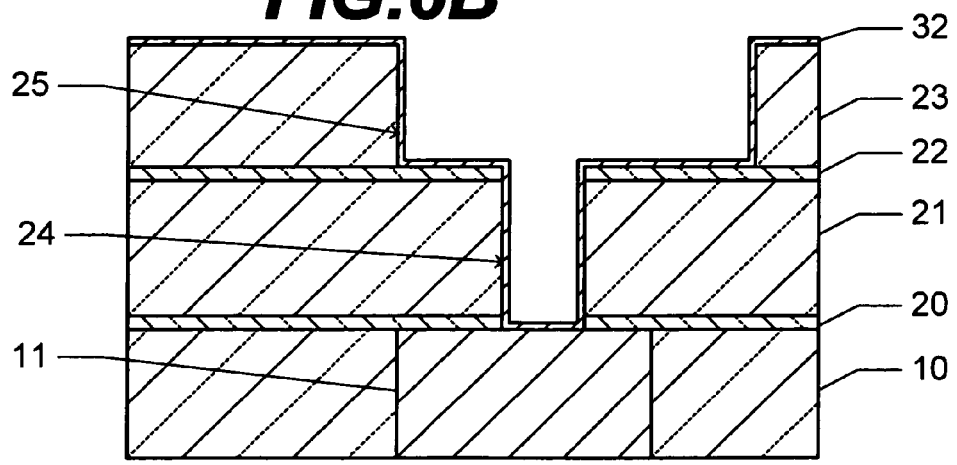

As shown in FIG. 6B, a first film 32 of Mn having a thickness of 2 nm is formed by CVD on the upper surface of the wiring interlayer insulating film 23, the inner surface of the wiring trench 25 and the inner surface of the via hole 24. The first film 32 is formed by the same method as that used for forming the first film 32 of the first embodiment shown in FIG. 3C.

Figure 6C:
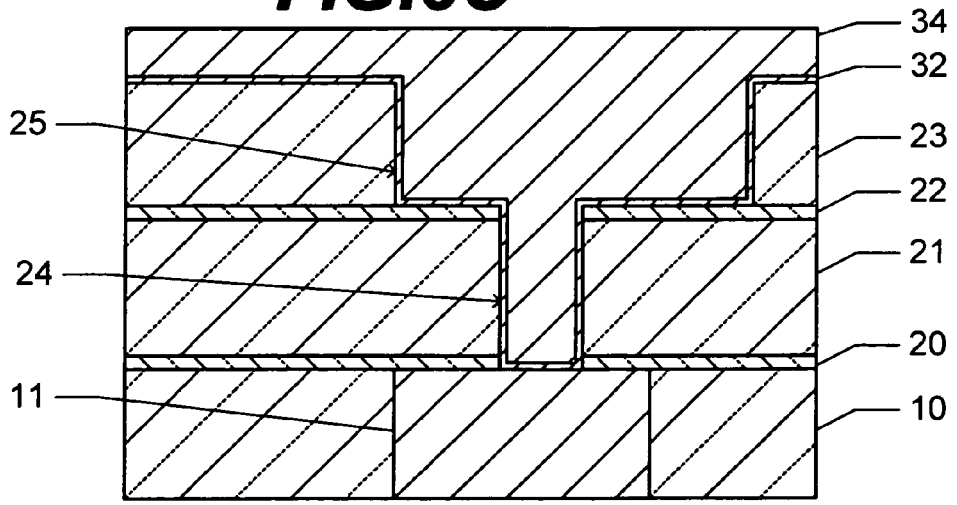

As shown in FIG. 6C, Cu is deposited by CVD on the first film 32 to form a conductive member 34. Therefore, the wiring trench 25 and via hole 24 are fully filled with the conductive member 34. The subsequent processes are the same as those executed after the intermediate time shown in FIG. 3D.

In the seventh embodiment, since the first film 32 shown in FIG. 6B is formed by CVD, sufficient adhesion can be ensured between the first film 32 and underlying insulating film. Further, since the conductive member 34 is also formed by CVD, Cu can be deposited in the fine via hole and wiring trench with better reproductivity, as compared to electroplating Cu.

Cu may be deposited by CVD in a partial space in the via hole 24 and wiring trench 25 and the remaining space may be embedded by electroplating.

Next, description will be made on a semiconductor device manufacture method according to the eighth embodiment. Although the first film 32 shown in FIG. 6B is made of Mn in the seventh embodiment, the first film of the eighth embodiment is made of alloy containing Cu and Mn. The first film 32 is formed by CVD similar to that for the first film 32 of the fourth embodiment.

Also in the eighth embodiment, since the first film 32 is formed by CVD, similar effects to those of the seventh embodiment can be obtained.

Next, with reference to FIGS. 7A and 7B, description will be made on a semiconductor device manufacture method according to the ninth embodiment.

Figure 7A:
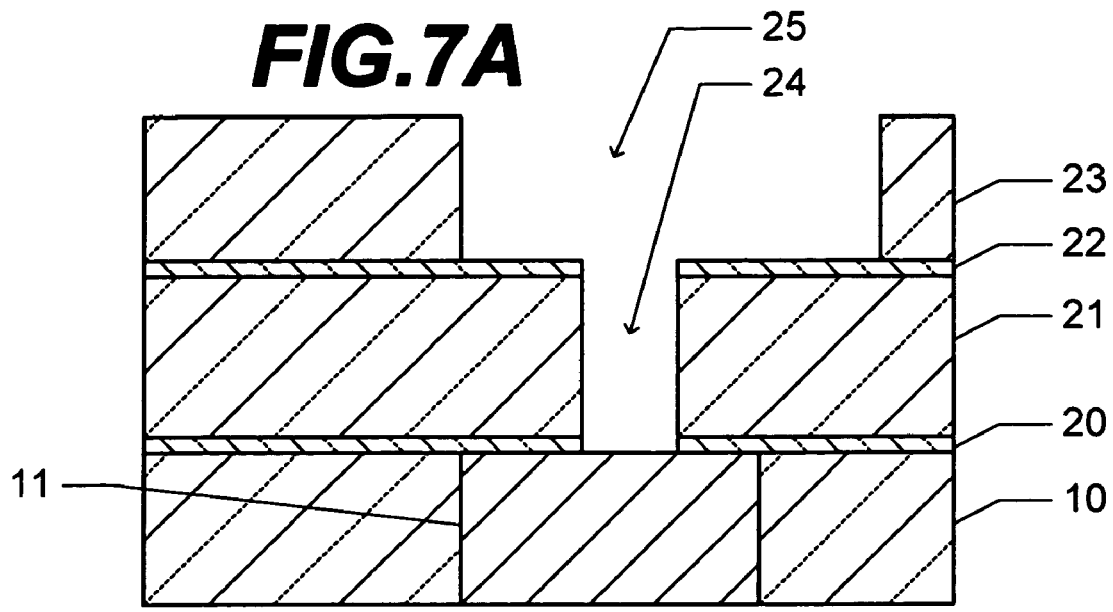
FIGS. 7A and 7B are cross sectional views of a device during manufacture, illustrating the semiconductor device manufacture method according to the ninth embodiment.

The structure shown in FIG. 7A is the same as that shown in FIG. 3B referred to when the first embodiment manufacture method was described.

Figure 7B:
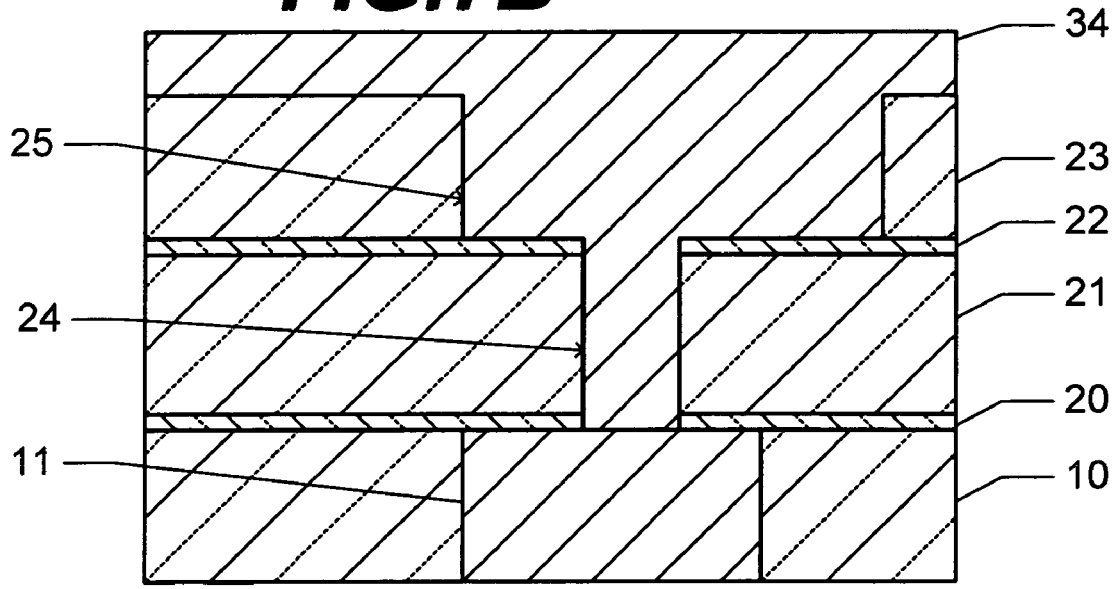

As shown in FIG. 7B, alloy containing Cu and Mn is deposited by CVD to embed CuMn alloy in the wiring trench 25 and via hole 24. A conductive member 34 of CuMn alloy is therefore formed. Namely, it can be considered that the ninth embodiment is the same as a method of continuing to form the first film 32 of the eighth embodiment shown in FIG. 6B until the via hole 24 and wiring trench 25 are fully filled with CuMn alloy. If it is difficult to fully fill the wiring trench 25 with CuMn alloy by using only CVD, CuMn alloy may be deposited by CVD and then Cu may be electroplated supplementarily. The subsequent processes are the same as those executed after the intermediate time shown in FIG. 3D.

For example, in depositing CuMn alloy by CVD, a supply amount of Mn source material is set to 0.004 g/min and a supply amount of Cu source material is set to 1.0 g/min. Under these conditions, CuMn alloy is deposited to a thickness of 500 nm. The total number of Mn atoms contained in the conductive member 34 is substantially equal to that of Mn atoms in the Mn film having a thickness of about 2 nm.

During annealing, Mn in the conductive member 34 is segregated on the inner surfaces of the via hole 24 and wiring trench 25 to form a barrier layer of MnSiO. At the same time, a cover film 36 of manganese oxide or the like is formed on the upper surface of the conductive member 34.

In the ninth embodiment, since the conductive member 34 itself is formed by CVD, sufficient adhesion of the conductive member 34 can be ensured.

The present invention has been described in connection with the preferred embodiments. The invention is not limited only to the above embodiments. It will be apparent to those skilled in the art that other various modifications, improvements, combinations, and the like can be made.

What we claim are:

1. A semiconductor device manufacture method comprising steps of:
    (a1) forming a concave portion in an interlayer insulating film formed over a semiconductor substrate;
    (a2) forming a first film of Mn by CVD, the first film covering an inner surface of the concave portion and an upper surface of the insulating film;
    (a3) depositing conductive material essentially consisting of Cu on the first film to embed the conductive material in the concave portion; and
    (a4) annealing the semiconductor substrate.

2. The semiconductor device manufacture method according to claim 1, wherein the step (a3) comprises steps of:
    forming a second film of Cu by CVD or sputtering, the second film covering a surface of the first film; and
    electroplating conductive material essentially consisting of Cu, by using the second film as an electrode.

3. The semiconductor device manufacture method according to claim 1, wherein in the step (a3), the conductive material is embedded in the concave portion by depositing the conductive material essentially consisting of Cu using CVD.

4. The semiconductor device manufacture method according to claim 1, wherein in the step (a2), bismethylcyclopentadienyl manganese or bisisopropylcyclopentadienyl manganese is used as Mn source.

* * * * *